(12) United States Patent
Lu et al.

(10) Patent No.: US 11,257,763 B2
(45) Date of Patent: Feb. 22, 2022

(54) ELECTRONIC DEVICE PACKAGE AND METHOD FOR MANUFACTURING THE SAME

(71) Applicant: Advanced Semiconductor Engineering, Inc., Kaohsiung (TW)

(72) Inventors: Mei-Ju Lu, Kaohsiung (TW); Jr-Wei Lin, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 29 days.

(21) Appl. No.: 16/702,213

(22) Filed: Dec. 3, 2019

(65) Prior Publication Data
US 2021/0167016 A1 Jun. 3, 2021

(51) Int. Cl.
| | | |
|---|---|---|
| H01L 23/538 | (2006.01) | |
| H01L 23/31 | (2006.01) | |
| H01L 23/367 | (2006.01) | |
| H01L 21/768 | (2006.01) | |
| H01L 23/00 | (2006.01) | |
| H01L 21/56 | (2006.01) | |

(52) U.S. Cl.
CPC ........ H01L 23/5384 (2013.01); H01L 21/563 (2013.01); H01L 21/76877 (2013.01); H01L 23/3121 (2013.01); H01L 23/367 (2013.01); H01L 24/05 (2013.01); *H01L 2224/02371* (2013.01); *H01L 2224/02372* (2013.01)

(58) Field of Classification Search
CPC ......... H01L 24/08; H01L 24/80; H01L 24/05; H01L 23/3128; H01L 23/367; H01L 23/5384; H01L 21/565
See application file for complete search history.

(56) References Cited

U.S. PATENT DOCUMENTS

| | | | |
|---|---|---|---|
| 2017/0250090 A1* | 8/2017 | Yu | H01L 24/05 |
| 2018/0348434 A1* | 12/2018 | Yim | G02B 6/34 |
| 2018/0374821 A1* | 12/2018 | Chen | H01L 23/3142 |
| 2021/0088722 A1* | 3/2021 | Razdan | G02B 6/12004 |

* cited by examiner

*Primary Examiner* — Zandra V Smith
*Assistant Examiner* — John M Parker
(74) *Attorney, Agent, or Firm* — Foley & Lardner LLP

(57) ABSTRACT

An electronic device package includes a substrate, a first semiconductor die, a second semiconductor die and an encapsulant. The substrate includes a first surface, and a second surface opposite to the first surface. The substrate defines a cavity recessed from the first surface. The first semiconductor die is disposed in the cavity. The second semiconductor die is disposed over and electrically connected to the first semiconductor die. The encapsulant is disposed in the cavity of the substrate. The encapsulant encapsulates a first sidewall of the first semiconductor die, and exposes a second sidewall of the first semiconductor die.

19 Claims, 16 Drawing Sheets

ELECTRONIC DEVICE PACKAGE AND METHOD FOR MANUFACTURING THE SAME

BACKGROUND

1. Technical Field

The present disclosure relates to an electronic device package for high speed signal transmission and method for manufacturing the same.

2. Description of the Related Art

Chip-on-chip (CoC) package includes two electronic components stacked on each other. The stacked electronic components are in electrical communication with each other through wire bonding. The bond wires, however, have high electrical resistance and long transmission path. Therefore, CoC package suffers from signal integrity, particularly in high frequency application. In addition, the constraint of comparative wire bonding signal transmission is that the high impedance caused by the lengthy transmission path slow prevents speed data rate, for example, 100 Gbit/s, 400 Gbit/s, or 1.6 Tbit/s, from realization. In addition, silicon photonics and optical engine usually specify high speed data rate with the integration of at least an electronic IC (EIC) and a photonic IC (PIC).

SUMMARY

In some embodiments, an electronic device package includes a substrate, a first semiconductor die, a second semiconductor die and an encapsulant. The substrate includes a first surface, and a second surface opposite to the first surface. The substrate defines a cavity recessed from the first surface. The first semiconductor die is disposed in the cavity. The second semiconductor die is disposed over and electrically connected to the first semiconductor die. The encapsulant is disposed in the cavity of the substrate. The encapsulant encapsulates a first sidewall of the first semiconductor die, and exposes a second sidewall of the first semiconductor die.

In some embodiments, an electronic device package includes a substrate, a photonic IC, an electronic IC and a conductive through via. The substrate includes a first top surface, a second top surface lower than the first top surface, and a bottom surface opposite to the first top surface and the second top surface. The photonic IC is disposed on the second top surface of the substrate, and the photonic IC includes at least one exposed sidewall. The electronic IC is disposed over and electrically connected to the photonic IC. The conductive through via extends from the first top surface to the bottom surface of the substrate.

In some embodiments, a method of manufacturing an electronic device package includes following operations. A substrate is provided. The substrate is recessed from a first surface to form a cavity. A first semiconductor die is disposed in the cavity. An encapsulant is formed in the cavity to encapsulate sidewalls of the first semiconductor die. A second semiconductor die is disposed on the encapsulant. The encapsulant and the substrate are diced along a sidewall of the first semiconductor die to expose the sidewall of first semiconductor die.

BRIEF DESCRIPTION OF THE DRAWINGS

Aspects of some embodiments of the present disclosure are readily understood from the following detailed description when read with the accompanying figures. Various structures may not be drawn to scale, and the dimensions of the various structures may be arbitrarily increased or reduced for clarity of discussion.

DETAILED DESCRIPTION

Figure 1:
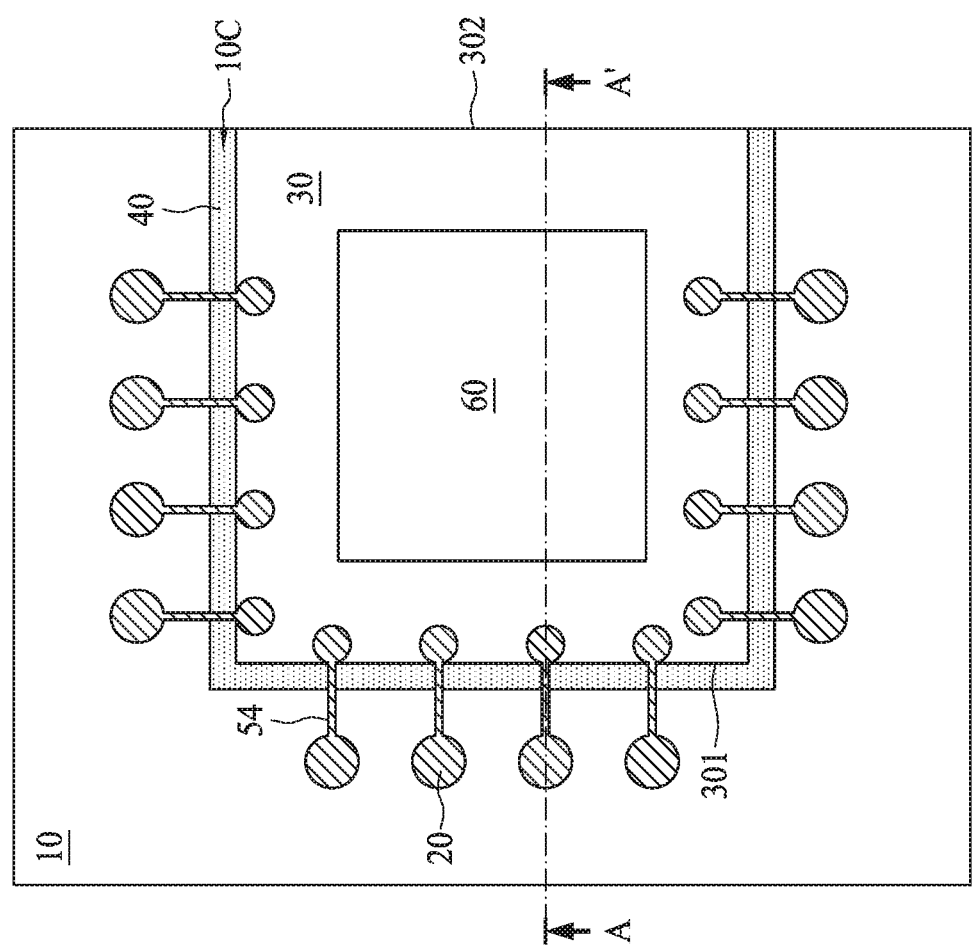
FIG. 1 is a schematic top view of an electronic device package in accordance with some embodiments of the present disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "above," "over," "on," "upper," "lower," "left," "right," "vertical," "horizontal," "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein the term "active surface" may refer to a surface of an electronic component on which contact terminals such as contact pads are disposed, and the term "inactive surface" may refer to another surface of the electronic component opposite to the active surface on which no contact terminals are disposed.

Some embodiments of the present disclosure provide fan-out package-on-package semiconductor package structures realizing high speed signal transmission, for example, greater than 400 Gbit/s. At least one of the electrical signals is first sent to an electronic IC (EIC) for amplification, and then arriving at a photonic IC (PIC). For example, EIC may include both active semiconductor devices and passive circuit components and the electrically conductive paths interconnecting the active semiconductor devices and passive circuit components in electrical circuit relationships for performing a desired sub-circuit control function. PIC may include a combination of photonic devices in a circuit on a single substrate to achieve a desired function. For example, PIC may include lasers, receivers, waveguides, detectors, semiconductor optical amplifiers (SOA), gratings, and other active and passive semiconductor optical devices on a single substrate. The signal transmission path is designed in the package to have suitable impedance allowing the aforesaid high speed signal transmission. In some embodiments, high speed signal, for example, may possess a data rate of about 100 Gbit/s, 400 Gbit/s, or 1.6 Tbit/s.

Figure 1A:
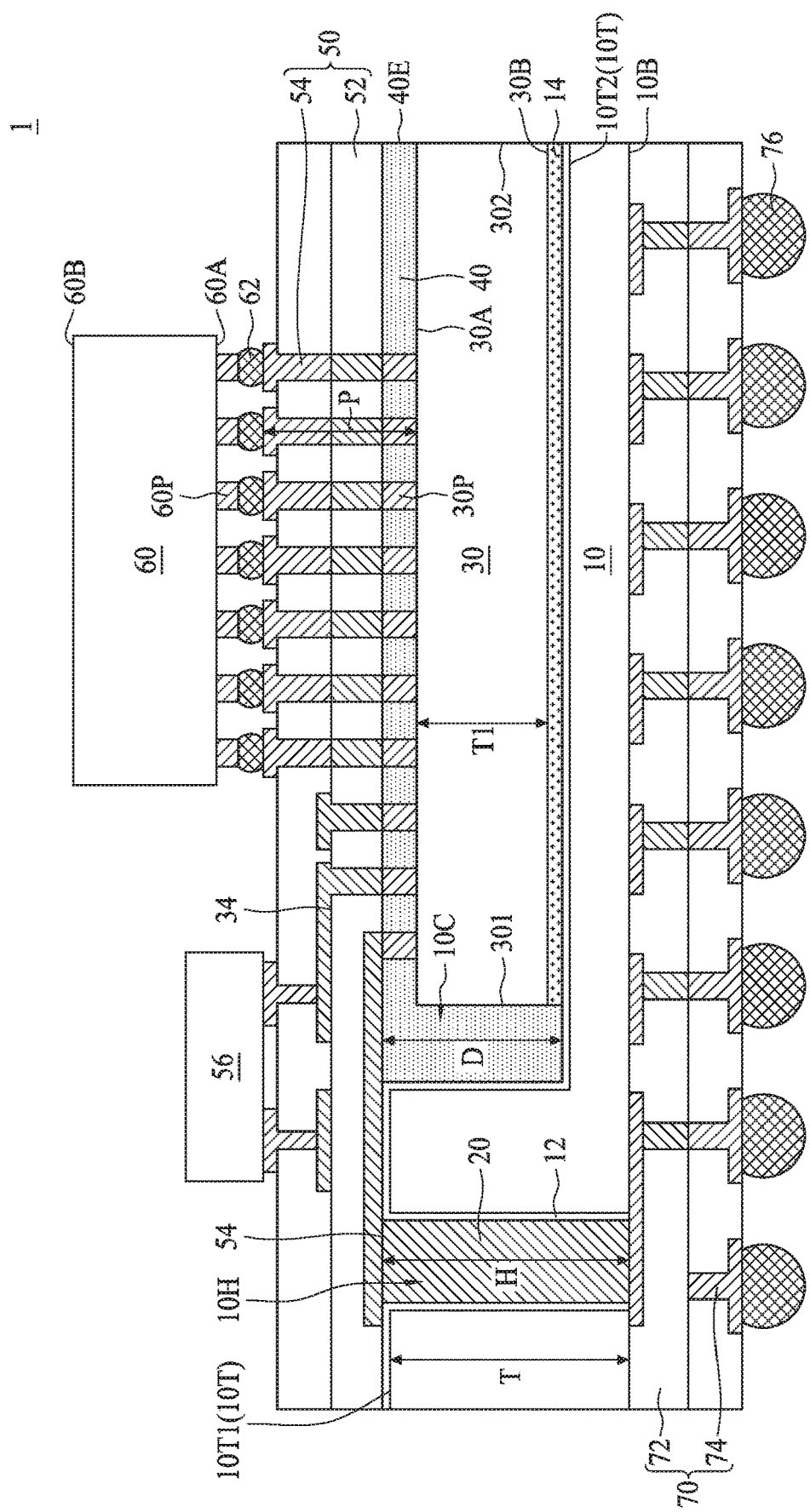
FIG. 1A is a schematic cross-sectional view of an electronic device package taken along a line A-A' in FIG. 1 in accordance with some embodiments of the present disclosure.

FIG. 1 is a schematic top view of an electronic device package 1 in accordance with some embodiments of the present disclosure, FIG. 1A is a schematic cross-sectional view of an electronic device package 1 taken along a line A-A' in FIG. 1 in accordance with some embodiments of the present disclosure. For the purpose of clarity, some components may not be shown in FIG. 1. As shown in FIG. 1 and FIG. 1A, the electronic device package 1 includes a substrate 10, a first semiconductor die 30, a second semiconductor die 60 and an encapsulant 40. The substrate 10 may include, but is not limited to, a semiconductor substrate such as a silicon substrate. The substrate 10 includes a first surface 10T, and a second surface 10B opposite to the first surface 10T. By way of example, the first surface 10T may be a top surface, and the second surface 10B may be a bottom surface. The substrate 10 defines a cavity 10C recessed from the first surface 10T. in other words, the first surface 10T of the substrate 10 includes a first top surface 10T1, and a second top surface 10T2 recessed from the first top surface 10T1 and lower than the first top surface 10T1. The cavity 10C is recessed from the first surface 10T without penetrating the substrate 10. Specifically, the bottom of the cavity 10C is confined by the substrate 10, and the top of the cavity 10C is exposed from the substrate 10. In some embodiments, a portion of the sides of the cavity 10C is confined by the substrate 10, while another portion of the sides of the cavity 10C is exposed from the substrate 10. By way of example, three sides of the cavity 10C are confined by the substrate 10, and one side of the cavity 10C is exposed from the substrate 10 as illustrated in FIG. 1. In some embodiments, an insulative film 12 such as a silicon oxide film may be disposed on the first top surface 10T1 and/or the second top surface 10T2 of the first surface 10T of the substrate 10, and may be disposed between the first semiconductor die 30 and the substrate 10.

The first semiconductor die 30 is disposed in the cavity 10C, and the second semiconductor die 60 is disposed over and electrically connected to the first semiconductor die 30. The second semiconductor die 60 is disposed outside the cavity 10C. The first semiconductor die 30 and the second semiconductor die 60 may include different types of dies or chips for providing different functions. By way of example, the first semiconductor die 30 may include a photonic IC (PIC), and the second semiconductor die 60 may include an electronic IC (EIC). In some embodiments, the first semiconductor die 30 is attached to the bottom of the cavity 10C by an adhesive layer 14 such as a die attaching film (DAF) with a first inactive surface 30B facing the substrate 10, while a first active surface 30A with electrical terminals 30P such as contact pads of the first semiconductor die 30 facing upward. In some embodiments, a thickness T1 of the first semiconductor die 30 is smaller than or substantially equal to a depth D of the cavity 10C. In some embodiments, upper surfaces of the electrical terminals 30P may be substantially leveled with the first top surface 10T1 of the substrate 10.

In some embodiments, the first active surface 30A of the first semiconductor die 30 faces a second active surface 60A with electrical terminals 60P such as contact pads of the second semiconductor die 60.

The encapsulant 40 is disposed in the cavity 10C of the substrate 10. The encapsulant 40 may include molding compounds such epoxy resin, and fillers such as silicon oxide fillers may be filled in the molding compound. The encapsulant 40 encapsulates a portion of the sidewalls of the first semiconductor die 30, and exposes another portion of the sidewalls of the first semiconductor die 30. By way of examples, the encapsulant 40 encapsulates a first sidewall (covered sidewall) 301 of the first semiconductor die, and exposes a second sidewall (exposed sidewall) 302 of the first semiconductor die 30. In some embodiments, three first sidewalls 301 are covered by the encapsulant 40, and one second sidewall 302 is exposed from the encapsulant 40. The exposed second sidewall 302 may be configured to allow the first semiconductor die 30 electrically coupling to an external component. By way of example, the exposed second sidewall 302 may be optically coupled to an optical fiber in cases the first semiconductor die 30 is a photonic IC. In some embodiments, an edge 40E of the encapsulant 40 may be substantially coplanar with the second sidewall 302 of the first semiconductor die 30. In some embodiments, the encapsulant 40 may further partially encapsulate the first active surface 30A of the first semiconductor die 30, and the electrical terminals 30P may be exposed from the encapsulant 40. In some embodiments, the encapsulant 40 covers the second top surface 10T2 or the insulative film 12 (if exists) in the cavity 10C, and exposes the first top surface 10T1 of the substrate 10. In some embodiments, the encapsulant 40 may be substantially leveled with the first top surface 10T1 or the insulative film 12 (if exists).

In some embodiments, the electronic device package 1 may further include a first redistribution layer (RDL) 50 disposed between the first surface 10T of the substrate 10 and the second semiconductor die, and electrically connected to the first semiconductor die 30 and the second semiconductor die 60. In some embodiments, the electrical terminals 60P of the second semiconductor die 60 may be bonded to the first RDL 50 through conductive structures 62. The conductive structures 62 may include conductive bumps such as solder bumps, conductive balls such as solder balls or the like. The first RDL 50 may include one or more insulation layers 52, and one or more conductive layers 54 stacked on each other. The material of the insulation layers 52 each may include organic insulative material such as epoxy resin, polyimide, bismaleimide-triazine (BT) resin, inorganic insulative material such as silicon oxide, silicon nitride, or a combination thereof. The conductive layers 54 each may include conductive traces, conductive vias, conductive pads or a combination thereof. The material of the conductive layers 54 each may include metal such as copper (Cu), aluminum (Al) or the like. In some embodiments, the electronic device package 1 may further include a passive component 56 such as a resistor, a capacitor, an inductor or a combination thereof 56 disposed on and electrically connected to the first RDL 50. In some embodiments, the coefficient of thermal expansion (CTE) of the insulation layer 52 is different from that of the encapsulant 40.

In some embodiments, the electronic device package 1 may further include a second RDL 70 disposed on the second surface 10B of the substrate 10. The second RDL 70 may include one or more insulation layers 72, and one or more conductive layers 74 stacked on each other. The material of the insulation layers 72 each may include organic insulative material such as epoxy resin, polyimide, bismaleimide-triazine (BT) resin, inorganic insulative material such as silicon oxide, silicon nitride, or a combination thereof. The conductive layers 74 each may include conductive traces, conductive vias, conductive pads or a combination thereof. The material of the conductive layers 74 each may include metal such as copper (Cu), aluminum (Al) or the like. In some embodiments, the electronic device package 1 may further include a plurality of electrical conductors 76 disposed on and electrically connected to the second RDL 70, and configured to electrically connect an external electronic component such as a printed circuit board (PCB). The electrical conductors may include conductive bumps such as solder bumps, conductive balls such as solder balls or the like. In some embodiments, the CTE of the insulation layer 72 is different from that of the encapsulant 40.

The first RDL 50 and the second RDL 70 each may include a bumping-level RDL or a substrate-level RDL. By way of example, the line width/spacing (L/S) of the first RDL 50 and/or the second RDL 70 may be between about 2 μm/about 2 μm and about 10 μm/about 10 μm or wider than about 10 μm/about 10 μm.

In some embodiments, the electronic device package 1 may further include a plurality of conductive through vias 20 extending from the first surface 10T to the second surface 10B of the substrate 10, and electrically connecting the first RDL 50 to the second RDL 70. The conductive through vias 20 may be filled in through holes 10H of the substrate 10, respectively. In some embodiments, the height H of the conductive through via 20 is substantially equal to a thickness T of the substrate 10. The material of conductive layers 74 may include metal such as copper (Cu) or the like. Each of the conductive through vias 20 may include an integrally-formed structure, or may be stacked by a plurality of conductive pieces. The insulative film 12 may extend to the through hole 10H and may be disposed between the substrate 10 and the conductive through via 20, and configured as an adhesive layer or a barrier layer. In some embodiments, a seed layer (not shown) may be disposed between the conductive through via 20 and the substrate 10.

In some embodiments of the present disclosure, the first semiconductor die 30 is die-to-die bond to the second semiconductor die 60, and the first RDL 50 may be configured as a fan-out structure between the first semiconductor die 30 and the second semiconductor die 60. Thus, an electrical connection path P can be established between the first semiconductor die 30 and the second semiconductor die 60 through the first RDL 50. The first RDL 50 is lower in resistance compared to bonding wires, and the die-to-die bonding using the first RDL 50 can shorten the transmission path between the first semiconductor die 30 and the second semiconductor die 60. Accordingly, induction effect and signal integrity issue can be alleviated, particularly in high frequency application. The first semiconductor die 30 is disposed in the cavity 10C of the substrate 10, and thus an overall thickness of the electronic device package 1 can be reduced. Furthermore, the encapsulant 40 is disposed in the cavity 10C to encapsulate the first semiconductor die 30, and the encapsulant 40 is located in the tiny spare space between the sides of the cavity 10C and the first sidewalls 301 of the semiconductor die 30. Accordingly, the amount of the encapsulant 40 can be greatly reduced. The amount reduction of the encapsulant 40 can greatly alleviate warpage issue due to the CTE mismatch between the encapsulant 40 and the insulation layer 52 of the first RDL 50, and thus reliability of the electronic device package 1 can be improved. The conductive through vias 20 may include high-density through vias such as through silicon vias to meet high I/O specification. Also, the conductive through via 20 is low in resistance and can create a short electrical path between the first RDL 50 and the second RDL 70 to meet the high speed signal transmission specification.

The electronic device packages and manufacturing methods of the present disclosure are not limited to the above-described embodiments, and may be implemented according to other embodiments. To streamline the description and for the convenience of comparison between various embodiments of the present disclosure, similar components of the following embodiments are marked with same numerals, and may not be redundantly described.

Figure 2:
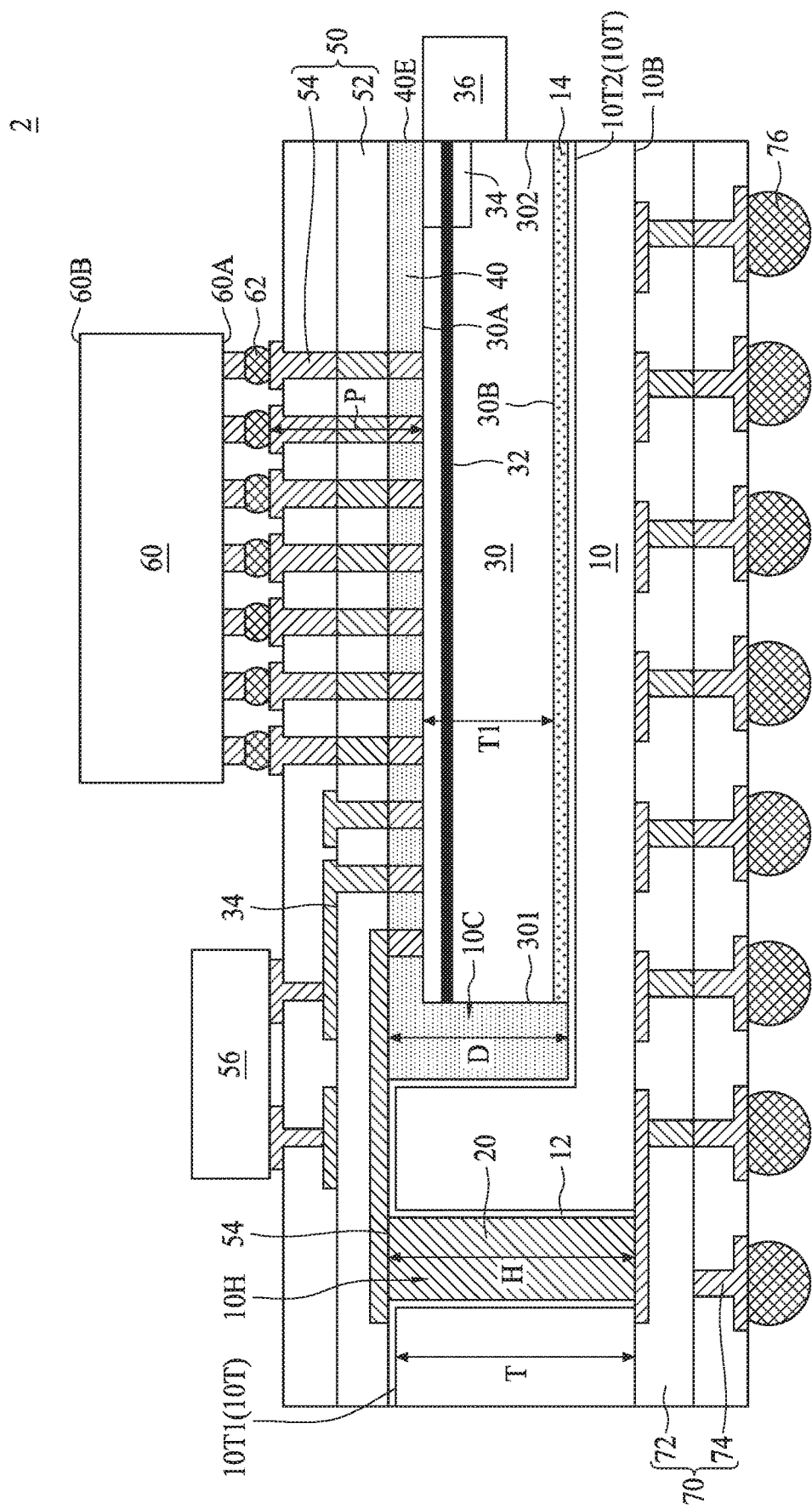
FIG. 2 is a schematic cross-sectional view of an electronic device package in accordance with some embodiments of the present disclosure.

FIG. 2 is a schematic cross-sectional view of an electronic device package 2 in accordance with some embodiments of the present disclosure. As shown in FIG. 2, the first semiconductor die 30 of the electronic device package 2 can be a photonic IC having a waveguide layer 32. The waveguide layer 32 may be disposed in proximity to the first active surface 30A. In some embodiments, the waveguide layer 32 may possess a greater refractive index than that of a cladding layer (not shown) surrounding the waveguide layer 32. For example, the waveguide layer 32 may include a plurality of waveguides, or optical channels. Each of the optical channels has a center wavelength (e.g., 1.48 μm, 1.52 μm, 1.55 μm, etc.), and each optical channel is typically assigned a minimum channel spacing or bandwidth to avoid crosstalk with other optical channels. The electronic device package 2 may further include a coupler 34 and an optical fiber 36. The coupler 34 may be substantially leveled with the waveguide layer 32. The optical fiber 36 is connected to the exposed second sidewall 302, and optically coupled to the waveguide layer 32 of the first semiconductor die 30 through the coupler 34 in a lateral direction.

Figure 3:
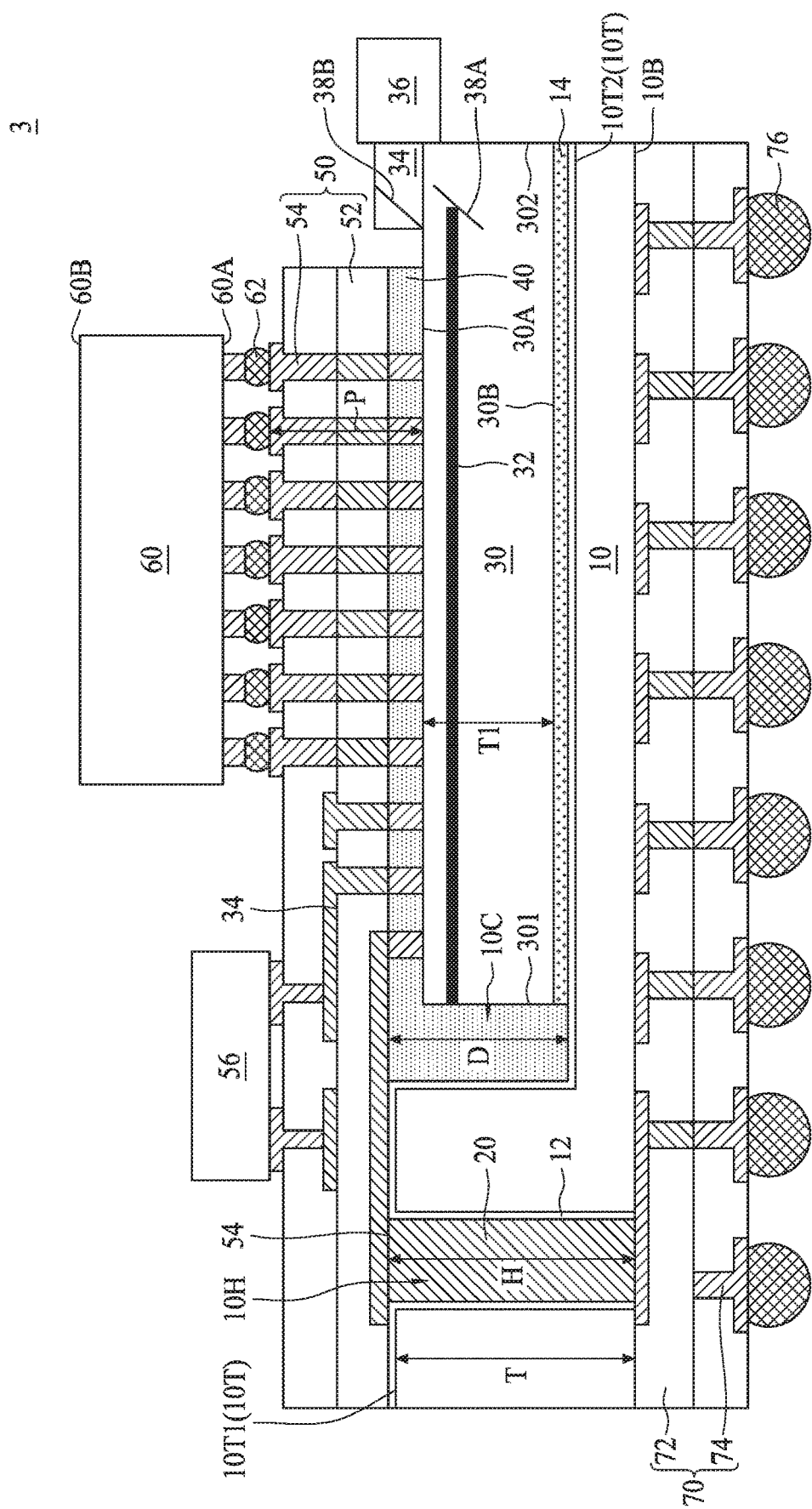
FIG. 3 is a schematic cross-sectional view of an electronic device package in accordance with some embodiments of the present disclosure.

FIG. 3 is a schematic cross-sectional view of an electronic device package 3 in accordance with some embodiments of the present disclosure. As shown in FIG. 3, in contrast to the electronic device package 2 in FIG. 2, a portion of the first active surface 30A of the first semiconductor die 30 is exposed from the encapsulant 40 and the first RDL 50. The optical fiber 36 is optically coupled to the first semiconductor die 30 through the exposed portion of the first active surface 30A. In some embodiments, the optical fiber 36 may be optically coupled to the waveguide layer 32 through, for example, a pair of reflectors 38A, 38B, and the coupler 34. The reflector 38A can be machined in the body of the first semiconductor die 30 by a MEMS procedure so as to alter the optical path from a horizontal direction to a vertical direction, for example. The optical path is then altered again at the reflector 38B machined in the coupler 34 from a vertical direction to a horizontal direction, and subsequently propagating into the optical fiber 36. To reduce optical loss, boundaries between the first active surface 30A of the first semiconductor die 30 and the coupler 34 may father include a layer of anti-reflective coating (ARC) (not shown).

Figure 4:
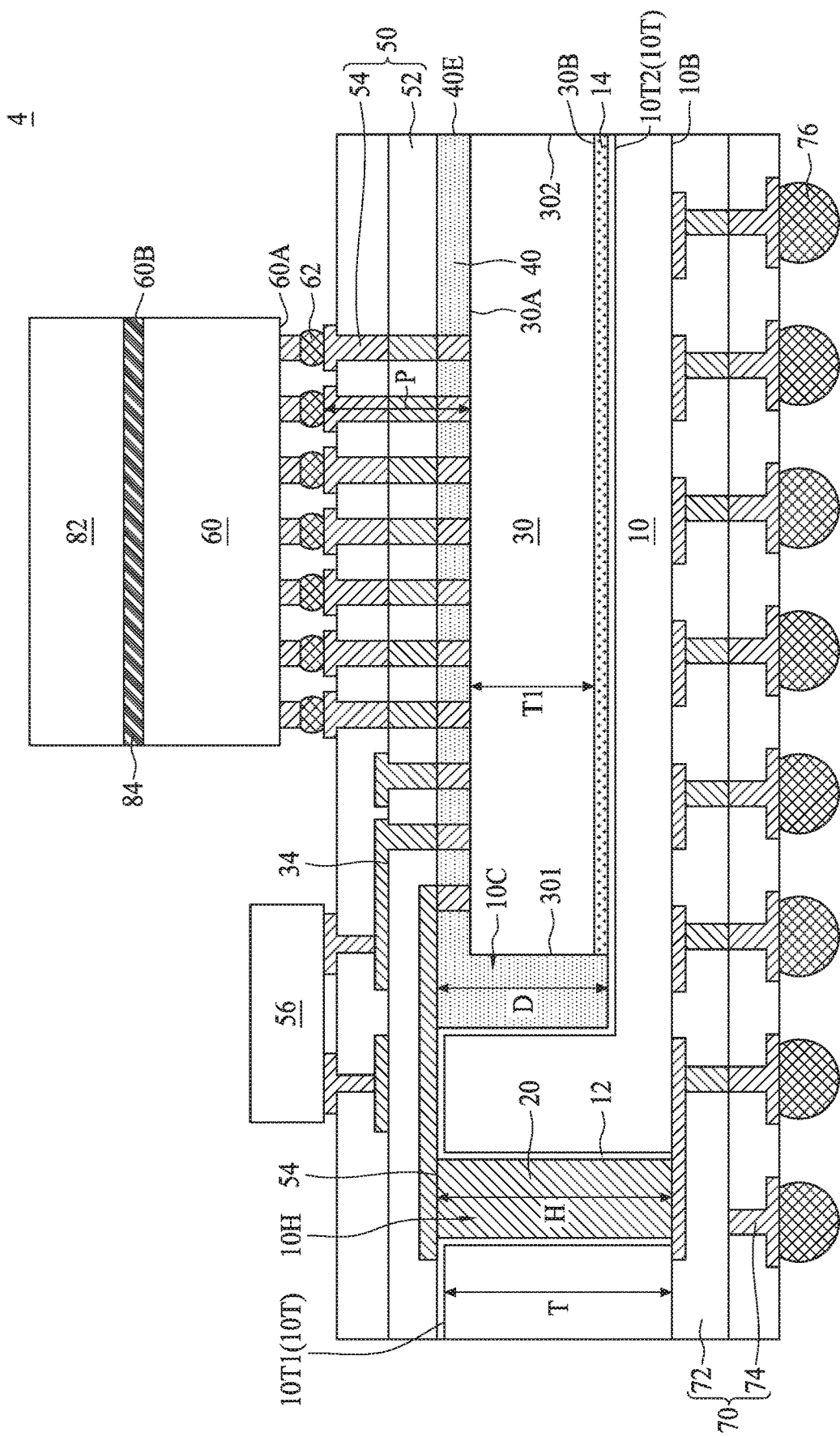
FIG. 4 is a schematic cross-sectional view of an electronic device package in accordance with some embodiments of the present disclosure.

FIG. 4 is a schematic cross-sectional view of an electronic device package 4 in accordance with some embodiments of the present disclosure. As shown in FIG. 4, the electronic device package 4 may further include a thermal dissipation structure 82 disposed on the second semiconductor die 60, and a thermal interface material 84 disposed between a second inactive surface 60B the second semiconductor die 60 and the thermal dissipation structure 82. The thermal dissipation structure 82 is configured to improve heat dissipation efficiency of the second semiconductor die 60. Examples of the thermal dissipation structure 82 may include heat sink, water cooling structure, fan or other suitable active and/or passive type heat dissipation structures.

Figure 5:
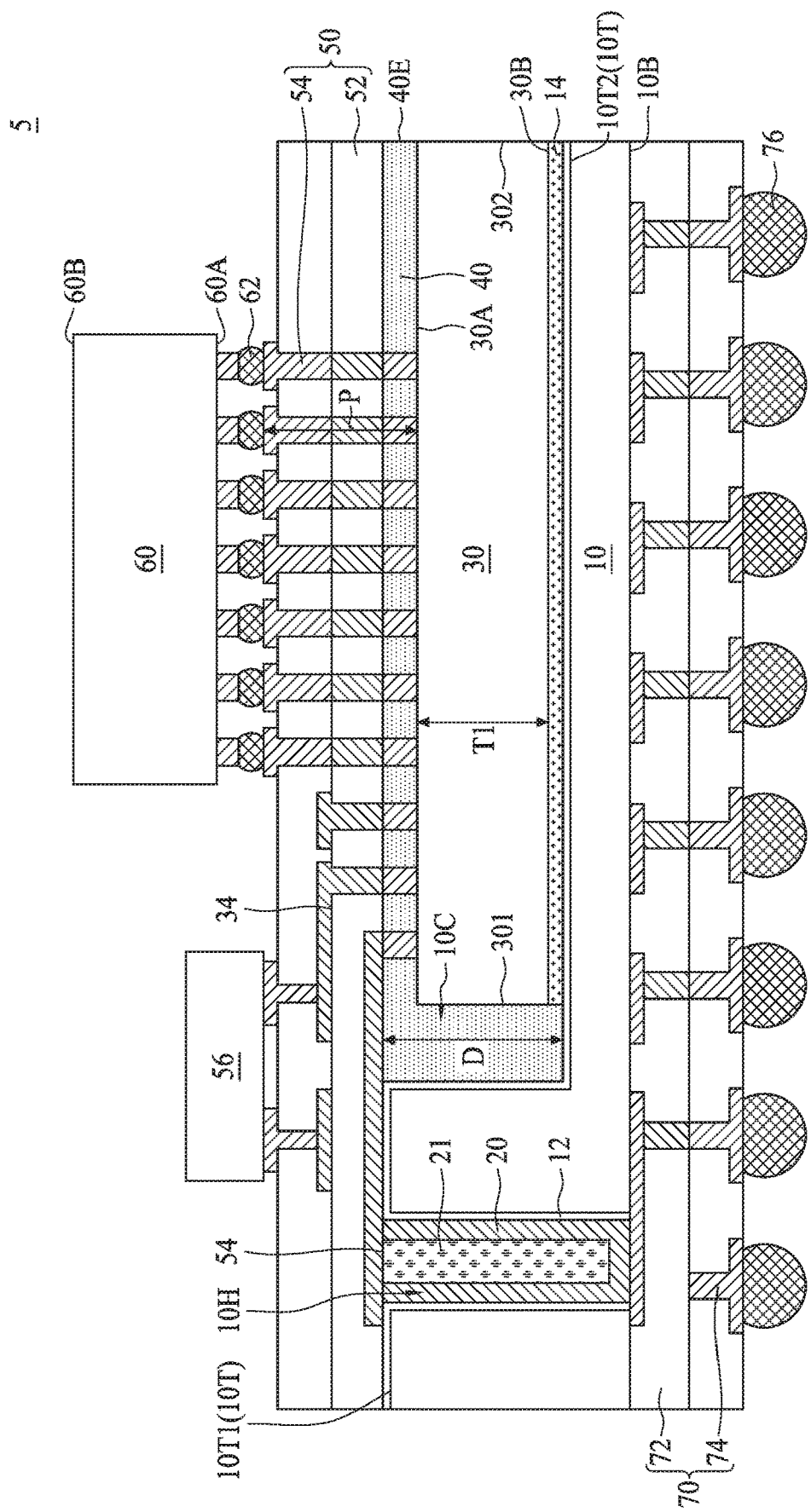
FIG. 5 is a schematic cross-sectional view of an electronic device package in accordance with some embodiments of the present disclosure.

FIG. 5 is a schematic cross-sectional view of an electronic device package 5 in accordance with some embodiments of the present disclosure. As shown in FIG. 5, in contrast to the electronic device package 1 in FIG. 1 and FIG. 1A, the electronic device package 5 may further include insulative fillers 21 inserted in the through holes 10H and surrounded by the conductive through vias 20, respectively. The conductive through via 20 may include liner conductive through via substantially conformal to profile of the through hole 10H. The insulative filler 21 may be configured to improve robustness and/or compensate CTE mismatch of the electronic device package 5.

Figure 6:
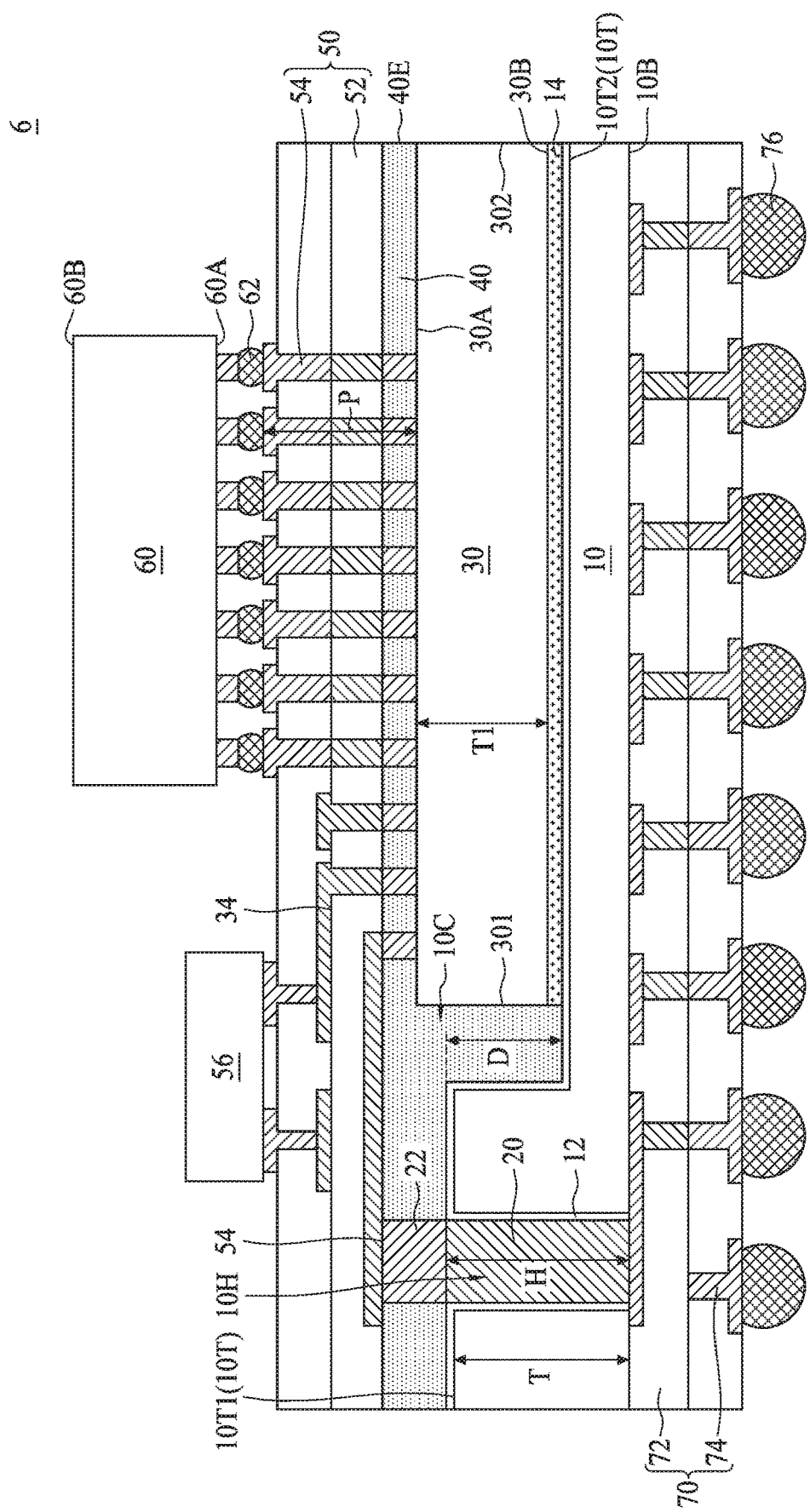
FIG. 6 is a schematic cross-sectional view of an electronic device package 6 in accordance with some embodiments of the present disclosure.

FIG. 6 is a schematic cross-sectional view of an electronic device package 6 in accordance with some embodiments of the present disclosure. As shown in FIG. 6, in contrast to the electronic device package 1 in FIG. 1 and FIG. 1A, the thickness T1 of the first semiconductor die 30 is larger than the depth D of the cavity 10C. A portion of the first semiconductor die 30 is higher than the first top surface 10T1 of the substrate 10. The electronic device package 6 may further a plurality of interconnectors 22 disposed on the conductive through vias 20 respectively to compensate the height gap between the conductive through vias 20 and the first RDL 50. A portion of the encapsulant 40 may further cover the first top surface 10T of the substrate 10, and laterally surround the interconnectors 22. In some embodiments, the interconnectors 22 may include conductive pillars such as copper pillars, conductive posts such as copper posts or the like. The electronic device package 6 may be modified to incorporate the features as disclosed in the embodiments of FIGS. 2-5.

Figure 7A:
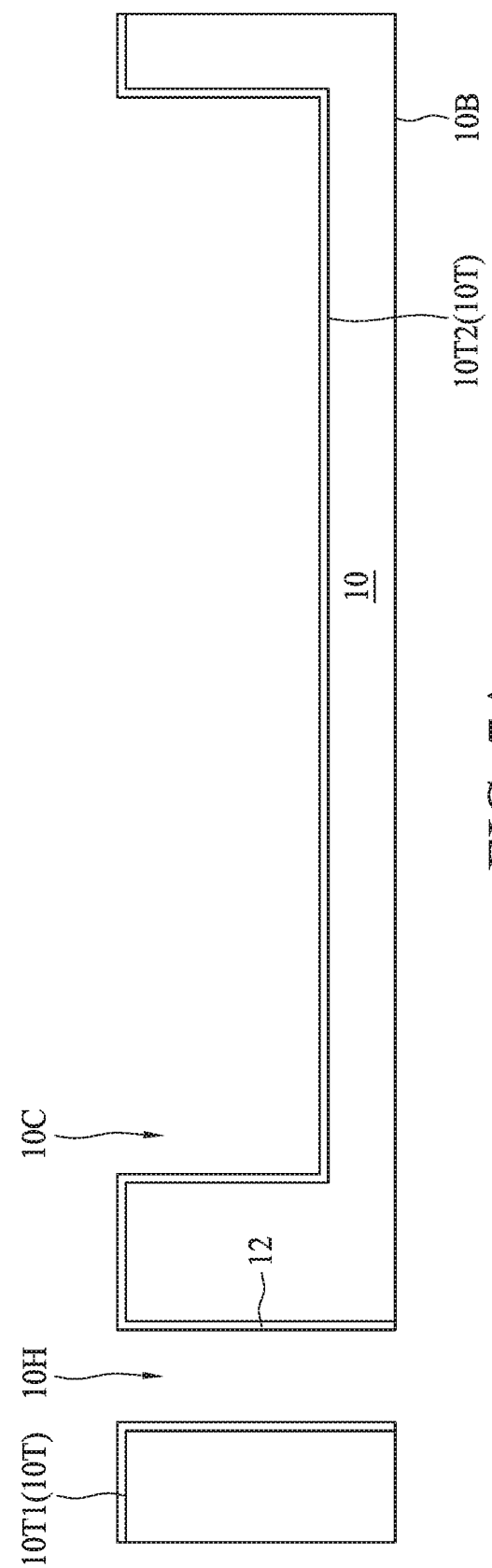
FIG. 7A, FIG. 7B, FIG. 7C, FIG. 7D, FIG. 7E, FIG. 7F, FIG. 7G, FIG. 7H and FIG. 7I illustrate operations of manufacturing an electronic device package in accordance with some embodiments of the present disclosure.

FIG. 7A, FIG. 7B, FIG. 7C, FIG. 7D, FIG. 7E, FIG. 7F, FIG. 7G, FIG. 7H and FIG. 7I illustrate operations of manufacturing an electronic device package in accordance with some embodiments of the present disclosure. As shown in FIG. 7A, a substrate 10 is provided. The substrate 10 is recessed from a first surface 10T to form a plurality of cavities 10C. The substrate 10 may be recessed by photolithography and etching technique for example. In some embodiments, a plurality of through holes 10H may be formed in the substrate and adjacent to the cavities 10C. In some embodiments, the through holes 10H may be formed by photolithography and etching technique, and can be formed simultaneously with the cavities 10C by the same process. In some embodiments, an insulative film 12 such as a silicon oxide film may be formed on the substrate 10.

Figure 7B:
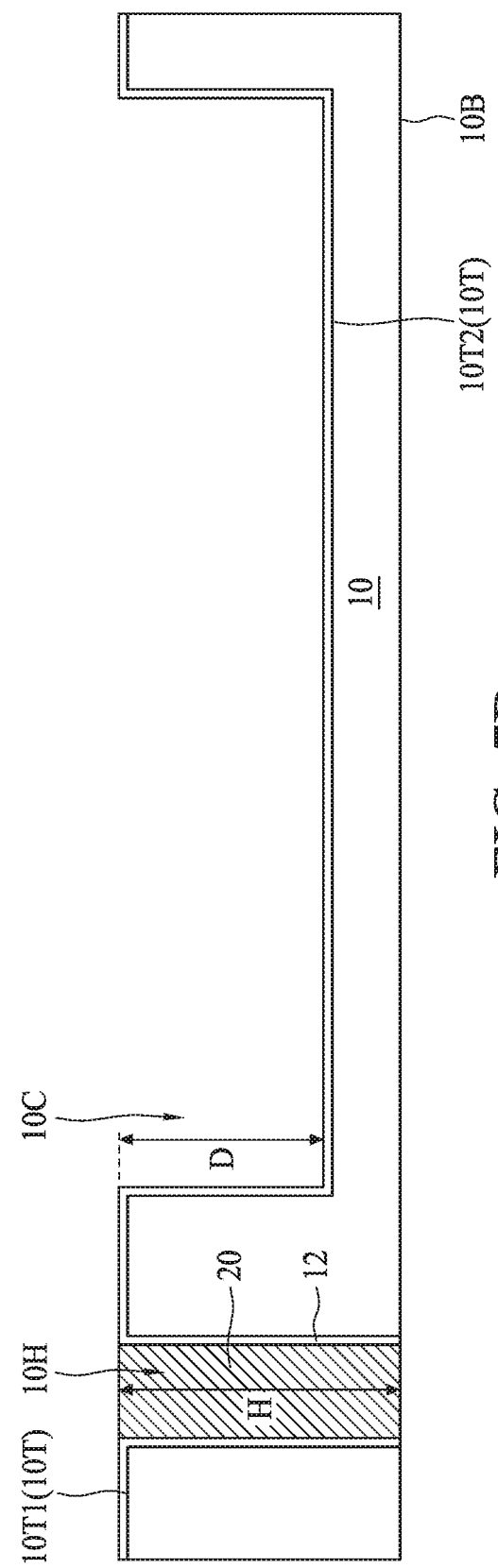
Figure 7C:
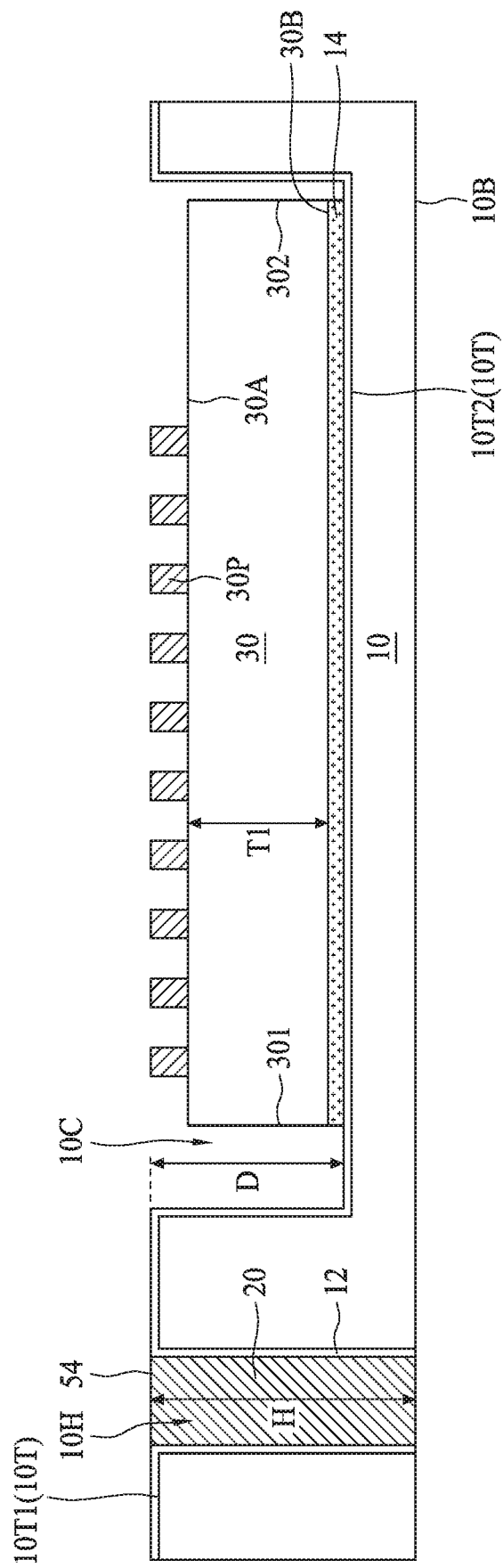

As shown in FIG. 7B, a plurality of conductive through vias 20 are formed in the through holes 10H. The conductive through vias 20 may be formed by electroplating, deposition or other suitable processes. As shown in FIG. 7C, a plurality of first semiconductor dies 30 are disposed in the cavities 10C. In some embodiments, each cavity 10C is disposed with at least one first semiconductor die 30. In some embodiments, the thickness T1 of the first semiconductor die 30 is smaller than or substantially equal to the depth D of the cavity 10C. In some other embodiments, the thickness T1 of the first semiconductor die 30 is larger than the depth D of the cavity 10C.

Figure 7D:
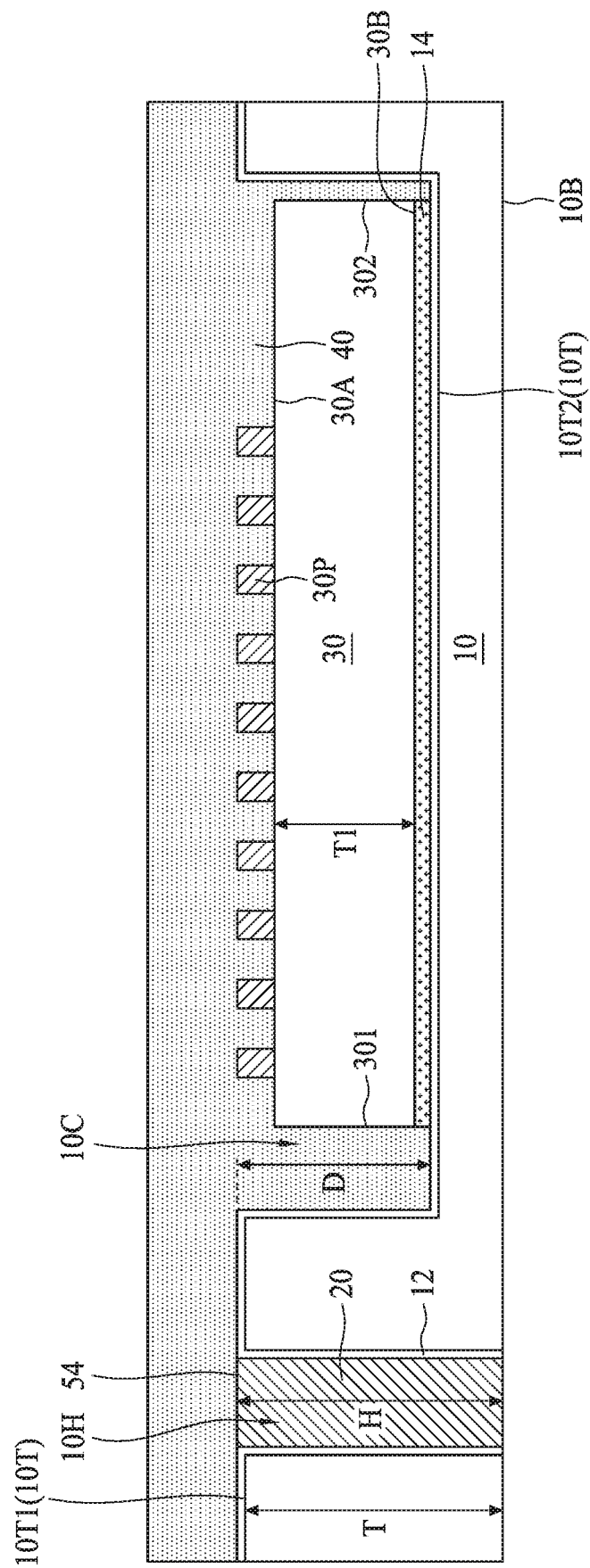
Figure 7E:
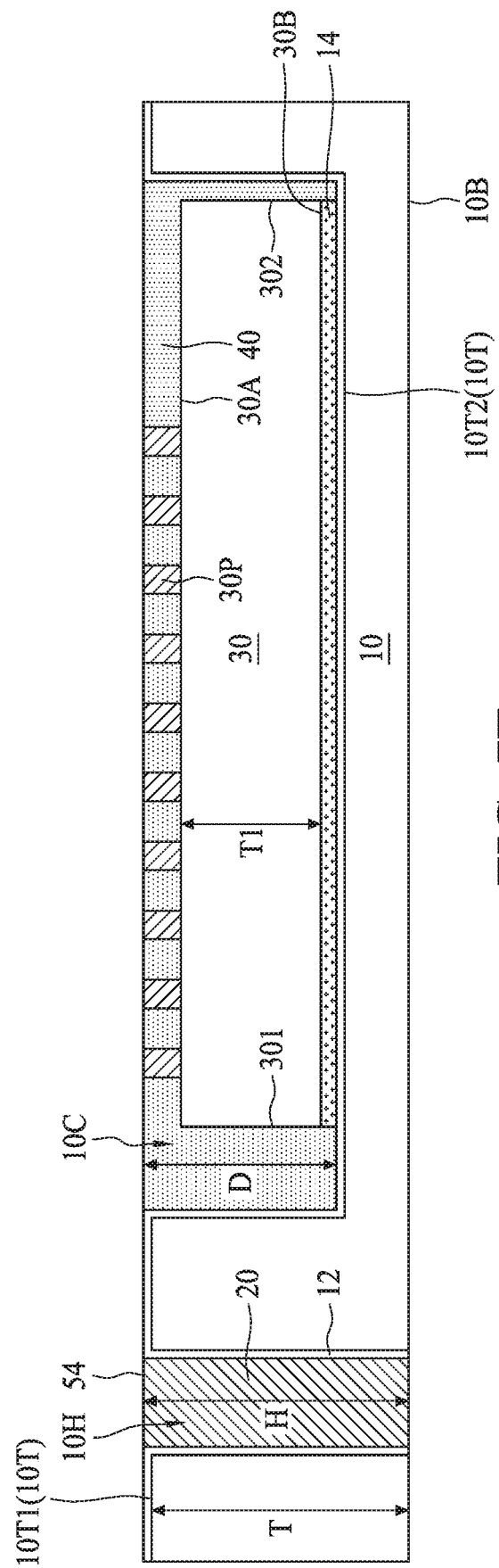

As shown in FIG. 7D, an encapsulant 40 is formed on the substrate 10 and in the cavities 10C to encapsulate first sidewalls 301 and second sidewalls 302 of the first semiconductor dies 30. In case the thickness T1 of the first semiconductor die 30 is larger than the depth D of the cavity 10C, interconnectors 22 (shown in FIG. 6) may be formed on the conductive through vias 20 prior to formation of the encapsulant 40. As shown in FIG. 7E, the encapsulant 40 outside the cavities 10C is removed by grinding, for example, to expose contact pads 30P of the first semiconductor dies 30.

Figure 7F:
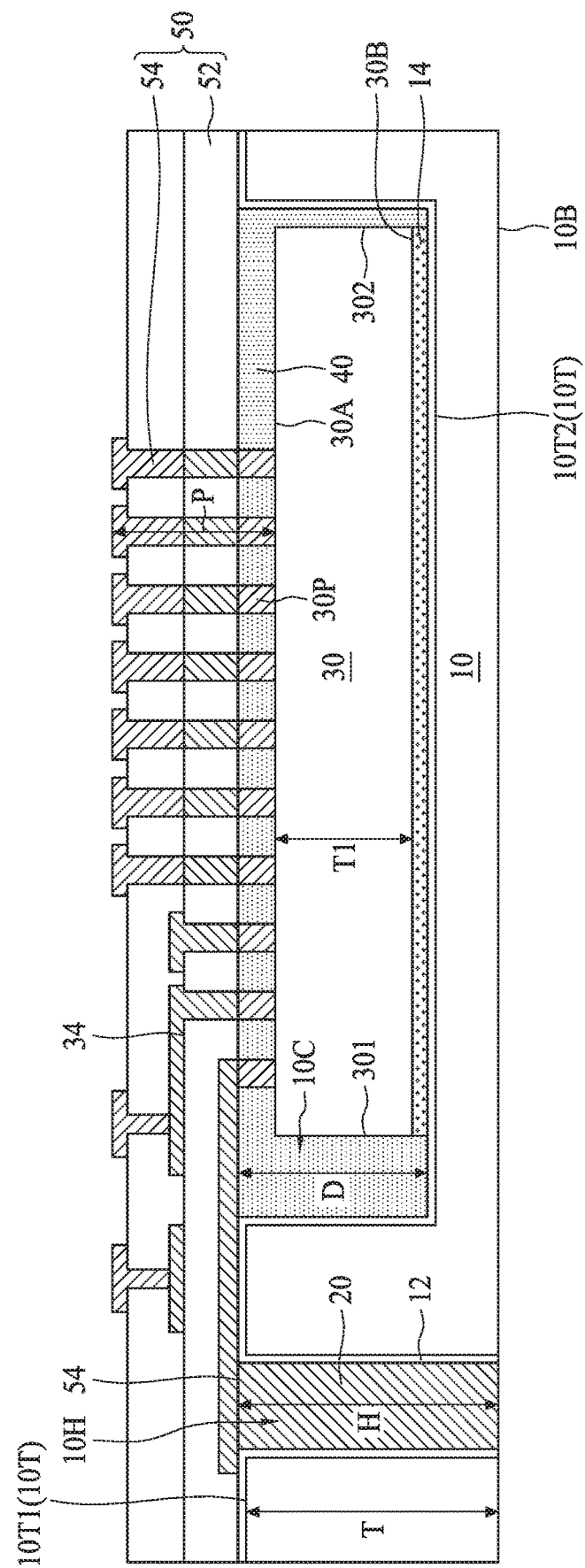
Figure 7G:
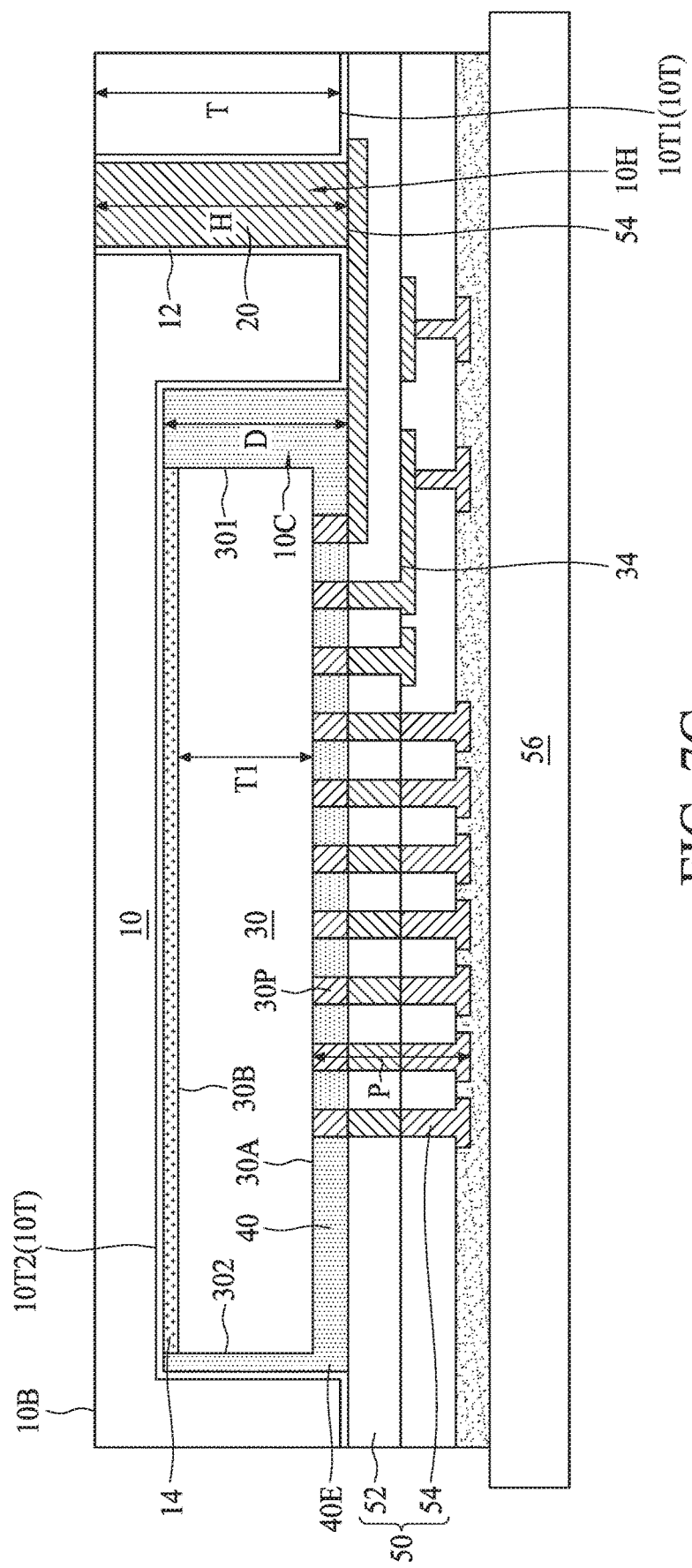
Figure 7H:
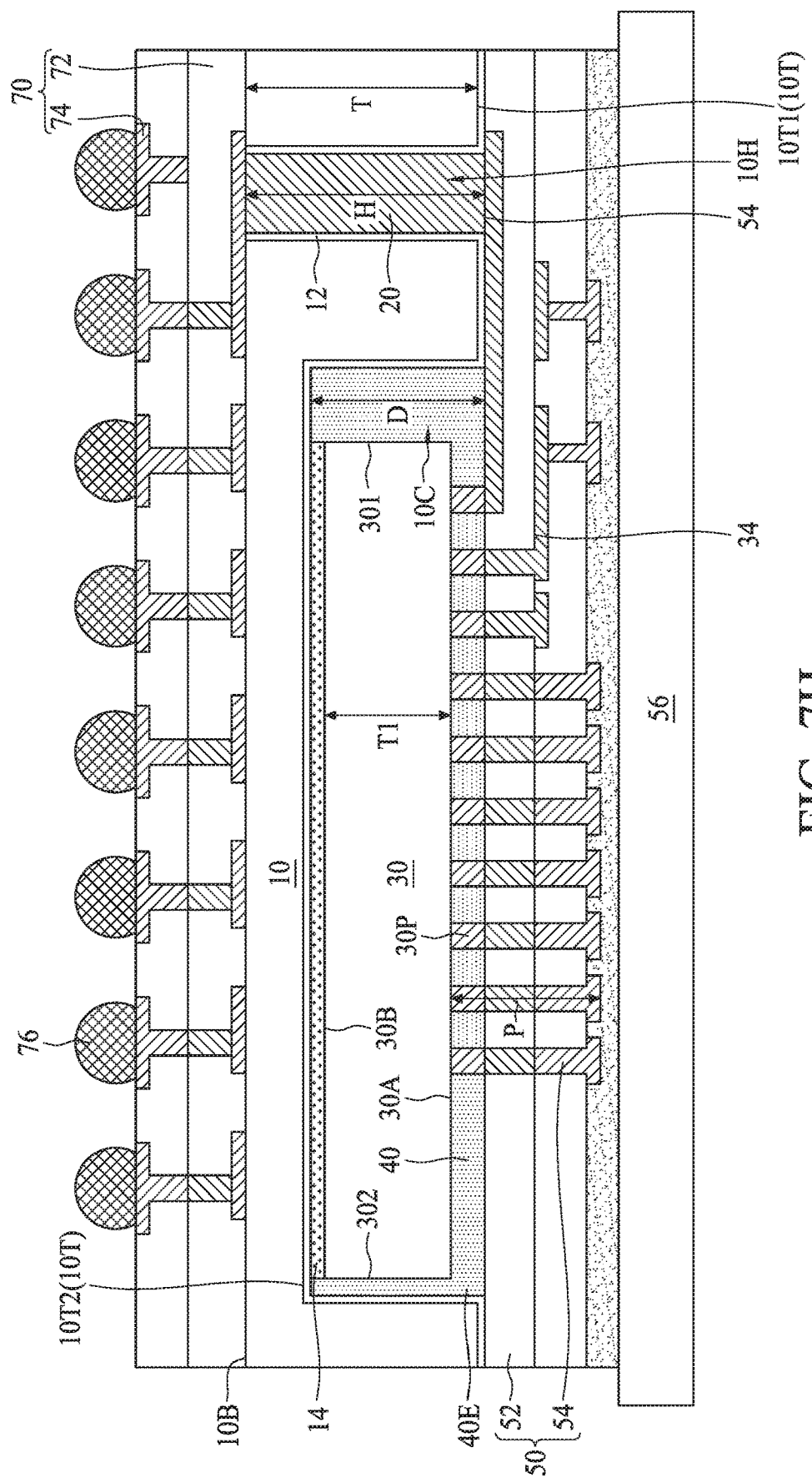
Figure 7I:
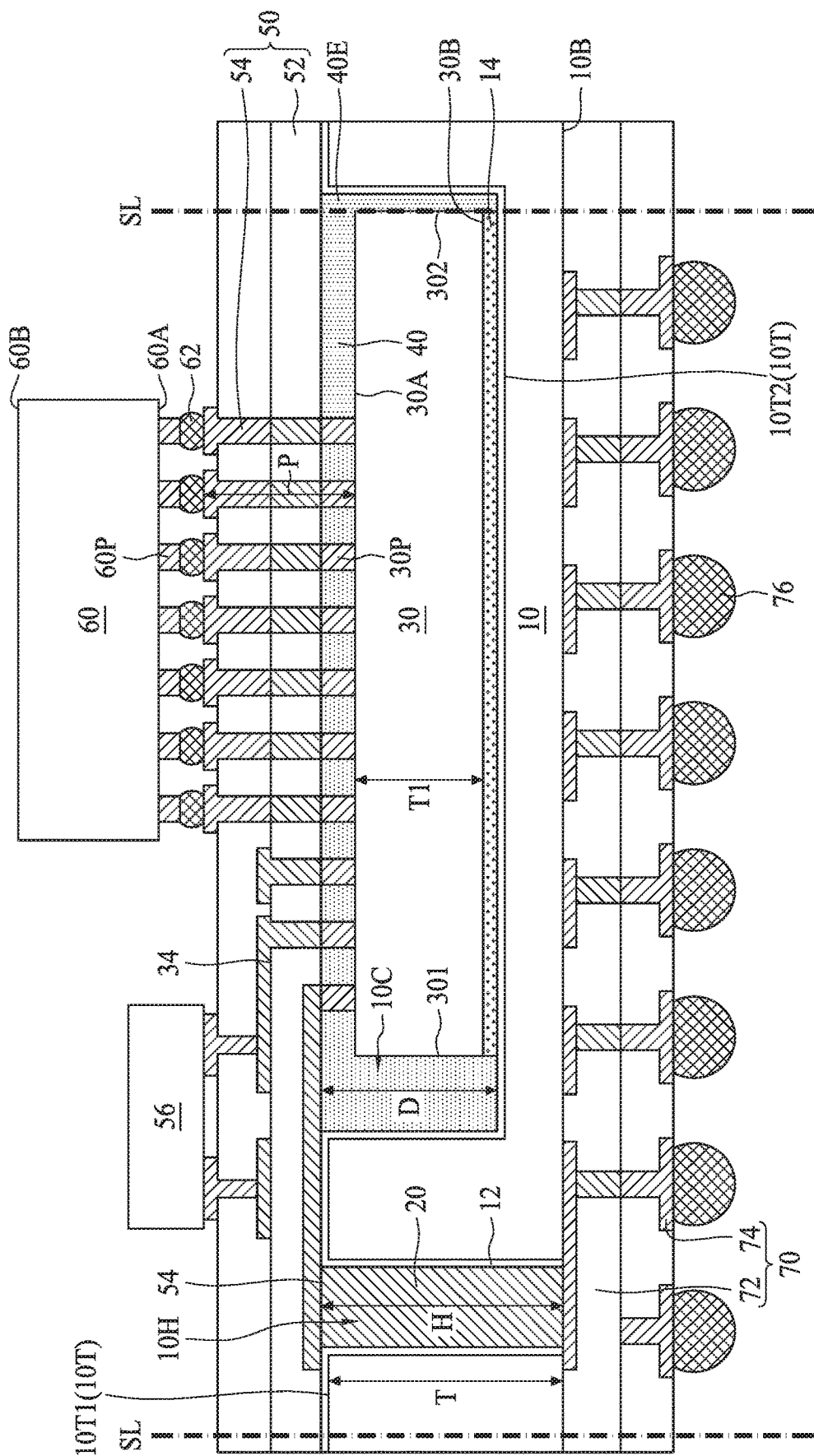

As shown in FIG. 7F, a first RDL 50 is formed on the first surface 10T of the substrate 10. As shown in FIG. 7G, the substrate 10 may be flipped over, and the first RDL 50 may be attached to a carrier 80 with a release layer 82. As shown in FIG. 7H, a second RDL 70 may be formed on the second surface 10B of the substrate 10. A plurality of electrical conductors 76 may be formed on and electrically connected to the second RDL 70. The carrier 80 and the release layer 82 are then removed from the first RDL 50. The substrate 10 is flipped, and a plurality of second semiconductor dies 60 are disposed on the encapsulant 40 and electrically connected to the first semiconductor dies 30 through the first RDL 50. The encapsulant 40 and the substrate 10 are diced along scribe lines SL. The scribe lines SL are at least along the second sidewalls 302 of the first semiconductor dies 30 to expose the second sidewalls 302 of first semiconductor dies 30 to form the electronic device packages as illustrated in FIGS. 1-6.

In some embodiments of the present disclosure, the PIC is die-to-die bond to the EIC, and a fan-out structure is disposed between the PIC and the EIC. Thus, an electrical connection path can be established between the PIC and the EIC through the fan-out structure. The fan-out structure is lower in electrical resistance compared to bonding wires, and the die-to-die bonding using the fan-out structure can shorten the transmission path between the PIC and the EIC. Accordingly, induction effect and signal integrity issue can be alleviated, particularly in high frequency application. The PIC is disposed in the cavity of the substrate, and thus an overall thickness of the electronic device package can be reduced. Furthermore, the encapsulant is disposed in the cavity to encapsulate the PIC, and the encapsulant is located in the tiny spare space between the sides of the cavity and a portion of the sidewalls of the PIC. Accordingly, the amount of the encapsulant can be greatly reduced. The amount reduction of the encapsulant can greatly alleviate warpage issue due to the CTE mismatch between the encapsulant and the fan-out structure, and thus reliability of the electronic device package can be improved. The conductive through vias may include high-density through vias such as through silicon vias meeting high I/O specification.

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:
1. An electronic device package, comprising:
   a substrate including a first surface, and a second surface opposite to the first surface, wherein the substrate defines a cavity recessed from the first surface;
   a first semiconductor die disposed in the cavity;
   a second semiconductor die disposed over and electrically connected to the first semiconductor die;
   an encapsulant disposed in the cavity of the substrate, wherein the encapsulant encapsulates a first sidewall of the first semiconductor die, and exposes a second sidewall of the first semiconductor die; and
   a first redistribution layer (RDL) disposed between the first surface of the substrate and the second semiconductor die, and electrically connected to the first semiconductor die and the second semiconductor die.
2. The electronic device package of claim 1, wherein the first semiconductor die comprises a photonic IC, and the second semiconductor die comprises an electronic IC.
3. The electronic device package of claim 1, wherein the encapsulant further partially encapsulates a first active surface of the first semiconductor die.
4. The electronic device package of claim 3, wherein an edge of the encapsulant is substantially coplanar with the second sidewall of the first semiconductor die.
5. The electronic device package of claim 1, wherein a first active surface of the first semiconductor die faces a second active surface of the second semiconductor die.
6. The electronic device package of claim 1, further comprising a second RDL disposed on the second surface of the substrate.
7. The electronic device package of claim 6, further comprising a plurality of conductive through vias extending from the first surface to the second surface of the substrate, and electrically connecting the first RDL to the second RDL.
8. The electronic device package of claim 7, further comprising a plurality of interconnectors disposed on the conductive through vias respectively, surrounded by the encapsulant, and electrically connecting the conductive through vias to the first RDL.
9. The electronic device package of claim 7, wherein the encapsulant further covers the first surface of the substrate.
10. The electronic device package of claim 7, further comprising an insulative film between the substrate and the conductive through via.
11. The electronic device package of claim 1, wherein a thickness of the first semiconductor die is smaller than or substantially equal to a depth of the cavity.
12. The electronic device package of claim 1, wherein a thickness of the first semiconductor die is larger than a depth of the cavity.
13. The electronic device package of claim 1, further comprising an optical fiber optically coupled to the first semiconductor die.
14. The electronic device package of claim 1, further comprising:
   a thermal dissipation structure disposed on the second semiconductor die; and
   a thermal interface material disposed between the second semiconductor die and the thermal dissipation structure.
15. The electronic device package of claim 1, further comprising an adhesive layer between the first semiconductor die and the substrate to attach the first semiconductor die to the substrate.
16. An electronic device package, comprising:

a substrate including a first top surface, a second top surface lower than the first top surface, and a bottom surface opposite to the first top surface and the second top surface;

a photonic IC disposed on the second top surface of the substrate, wherein the photonic IC includes at least one exposed sidewall;

an electronic IC disposed over and electrically connected to the photonic IC;

a conductive through via extending from the first top surface to the bottom surface of the substrate; and a first redistribution layer (RDL) disposed between the photonic IC and the electronic IC, and electrically connected to the conductive through via, the photonic IC and the electronic IC.

17. The electronic device package of claim 16, further comprising:

a second RDL disposed on the bottom surface of the substrate and electrically connected to the conductive through via.

18. The electronic device package of claim 16, further comprising an encapsulant disposed on the second top surface of the substrate, partially encapsulating the photonic IC and exposing the exposed sidewall of the photonic IC.

19. The electronic device package of claim 18, further comprising a conductive pillar disposed on and electrically connected to the conductive through via, and surrounded by the encapsulant.

* * * * *